(12) United States Patent
Kaajakari (10) Patent No.: US 10,291,203 B2
(45) Date of Patent: May 14, 2019

(54) PIEZOELECTRIC MEMS RESONATOR WITH A HIGH QUALITY FACTOR

(71) Applicant: Murata Manufacturing Co., Ltd., Nagaokakyo-shi, Kyoto-fu (JP)

(72) Inventor: Ville Kaajakari, Altadena, CA (US)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 304 days.

(21) Appl. No.: 15/207,801

(22) Filed: Jul. 12, 2016

(65) Prior Publication Data
US 2018/0019728 A1 Jan. 18, 2018

(51) Int. Cl.
| | | |
|---|---|---|
| *H03H 9/17* | (2006.01) | |
| *H01L 41/047* | (2006.01) | |
| *H01L 41/187* | (2006.01) | |
| *H03H 9/205* | (2006.01) | |
| *H03H 9/24* | (2006.01) | |
| *H03H 9/02* | (2006.01) | |

(52) U.S. Cl.
CPC ......... *H03H 9/171* (2013.01); *H01L 41/0478* (2013.01); *H01L 41/187* (2013.01); *H03H 9/176* (2013.01); *H03H 9/205* (2013.01); *H03H 9/2405* (2013.01); *H03H 2009/02503* (2013.01); *H03H 2009/2442* (2013.01)

(58) Field of Classification Search
CPC .............. H01L 41/0478; H01L 41/187; H03H 9/02015; H03H 9/02543; H03H 9/2405
See application file for complete search history.

(56) References Cited

U.S. PATENT DOCUMENTS

| | | | |
|---|---|---|---|
| 4,640,756 A | * | 2/1987 | Wang ................... C23C 14/225 204/192.18 |
| 5,361,045 A | | 11/1994 | Beaussier et al. |
| 7,489,065 B2 | | 2/2009 | Kando |
| 7,924,119 B1 | | 4/2011 | Ayazi et al. |
| 8,004,165 B2 | | 8/2011 | Furuhata et al. |
| 8,222,970 B2 | | 7/2012 | Inoue et al. |
| 8,304,967 B2 | | 11/2012 | Takizawa |
| 8,310,129 B2 | | 11/2012 | Defay et al. |
| 8,587,391 B2 | | 11/2013 | Gilbert et al. |
| 8,786,166 B2 | | 7/2014 | Jaakkola et al. |
| 8,916,942 B2 | | 12/2014 | Pensala et al. |

(Continued)

FOREIGN PATENT DOCUMENTS

WO  WO 2015111503 A1  7/2015

OTHER PUBLICATIONS

Gianluca Piazza et al.; "Piezoelectric Aluminum Nitride Vibrating Contour-Mode MEMS Resonators"; Journal of Microelectromechanical Systems, vol. 15, No. 6, Dec. 2006.

Ville Kaajakari et al.; "Square-Extensional Mode Single-Crystal Silicon Mircomechanical Resonator for Low-Phase-Noise Oscillator Applications": IEEE Electron Device Letters, vol. 25, No. 4, Apr. 2004.

(Continued)

*Primary Examiner* — Bryan P Gordon
(74) *Attorney, Agent, or Firm* — Arent Fox LLP (57) ABSTRACT

A MEMS resonator is provided with a high quality factor and lower motional impedance. The MEMS resonator includes a silicon layer having opposing surfaces, a piezoelectric layer above one of the surfaces of the silicon layer, and a pair of electrodes disposed on opposing surfaces of the piezoelectric layer, respectively. Moreover, the piezoelectric layer has a crystallographic axis that extends at an angle relative to the vertical axis of the MEMS resonator.

19 Claims, 10 Drawing Sheets

(56) References Cited

U.S. PATENT DOCUMENTS

| | | | |
|---|---|---|---|
| 9,071,226 B2 | 6/2015 | Jaakkola et al. | |
| 9,090,451 B1 | 7/2015 | Pan et al. | |
| 2004/0007940 A1* | 1/2004 | Tsai | H03H 3/02 |
| | | | 310/313 R |
| 2006/0158283 A1 | 7/2006 | Hikita et al. | |
| 2008/0150656 A1* | 6/2008 | Hagelin | H03H 9/02244 |
| | | | 333/200 |
| 2009/0237180 A1* | 9/2009 | Yoshida | H03H 3/04 |
| | | | 333/189 |
| 2011/0121689 A1 | 5/2011 | Grannen et al. | |
| 2011/0304412 A1 | 12/2011 | Zhang | |
| 2012/0092082 A1* | 4/2012 | Hentz | H03H 9/02338 |
| | | | 331/154 |
| 2013/0106248 A1* | 5/2013 | Burak | H03H 9/173 |
| | | | 310/360 |
| 2013/0106534 A1 | 5/2013 | Burak et al. | |
| 2014/0077898 A1 | 3/2014 | Pensala et al. | |
| 2016/0329877 A1 | 11/2016 | Nishimura et al. | |
| 2017/0111028 A1* | 4/2017 | McCarron | H01J 37/3447 |

OTHER PUBLICATIONS

G. Wingqvist et al.; "Mass sensitivity of multilayer thin film resonant BAW sensors"; Sensors and Actuators A 148 (2008) 88-95.

M. Suzuki et al.; "C-axis parallel oriented A1N film resonator fabricated by ion-beam assisted RF magnetron sputtering"; 2011 IEEE Interntional Ultrasonics Symposium Proceedings, pp. 1230-1233.

M. Suzuki, et al.; "Polarization-inverted multilayered pure shear mode A1N film resonator"; 2011 IEEE International Ultrasonics Symposium Proceedings; pp. 312-315.

Nathan Jackson et al.;"Influence of aluminum nitride crystal orientation on MEMS energy harvesting device performance"; IOP Publication, Journal of Mircomechanics and Microengineering vol. 23, Jun. 10, 2013, 9 pages; (retrieved Mar. 15, 2017), <URL:stacks.iop.org/JMMM/23/075014>.

Vikram Thakar et al.; "Temperature-Compensated Piezoelectrically Actuated Lame-Mode Resonators"; IEEE MEMS 2014, San Francisco, CA, USA, Jan. 26-30, 2014, pp. 214-217. (retrieved Mar. 17, 2017). Retrieved from the internet: <URL:http://web.eecs.umich.edu/~minar/pdf/MEMS2014.pdf>.

* cited by examiner

PIEZOELECTRIC MEMS RESONATOR
WITH A HIGH QUALITY FACTOR

FIELD OF THE INVENTION

The present invention relates to a MEMS resonator, and, more particularly, to a MEMS resonator with a high quality factor.

BACKGROUND OF THE INVENTION

Microelectromechanical system ("MEMS") resonators are small electromechanical structures that vibrate at high frequencies and are often used for timing references, signal filtering, mass sensing, biological sensing, motion sensing, and other applications. MEMS resonators are considered a common alternative to quartz timing devices. In general, quartz resonators have a high quality factor and piezoelectric coupling. High quality factor indicates a low rate of energy loss relative to the stored energy of the resonator, i.e., the oscillations die out more slowly. However, one limitation for quartz resonators is that they are difficult to design in smaller sizes.

Typically, MEMS resonators are made of silicon using lithography based manufacturing processes and wafer level processing techniques. Designers and manufacturers have found that pure silicon resonators often demonstrate very high quality factors comparable to quartz crystals, for example, as described in Non-patent document 1, identified below. However, bare silicon is not piezoelectric and pure silicon resonators have high motional impedance making them unsuitable to replace quartz resonators in many applications.

In order to lower the motional impedance of MEMS resonator, some designs have added piezoelectric material, such as a layer of thin film of aluminum nitride (AlN), as described in Non-patent document 2, for example, identified below. In a typical piezoelectric MEMS resonator, a thin film of molybdenum may be sputtered onto the silicon followed by a layer of AlN and an additional layer of molybdenum. After thin film deposition, the metal layers, the AlN layer and the silicon are etched to form the resonator shape. With the resulting design, the lower and upper layers of molybdenum serve as electrodes to excite and detect the mechanical vibrations of the resonator.

Figure 1:
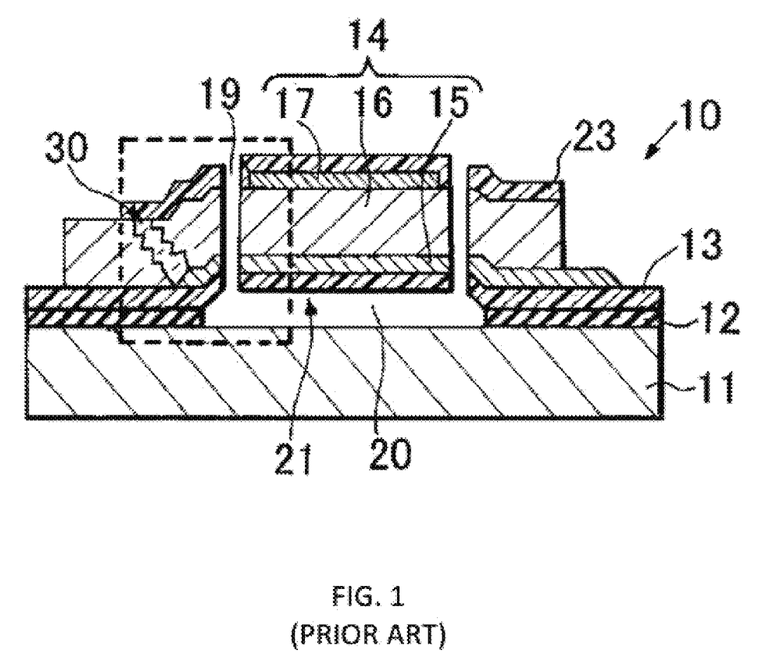
FIG. 1 illustrates a conventional film bulk acoustic resonator.

FIG. 1 illustrates a conventional film bulk acoustic resonator. As shown, the film bulk acoustic resonator 10 includes a pair of substrates layer 11 and 12 with an oscillation space 20, and a piezoelectric laminated structure 14 arranged to face the oscillation space 20. The piezoelectric laminated structure 14 includes a lower electrode 15, a piezoelectric thin film 16 and an upper electrode 17, which are arranged in sequence from the side close to the oscillation space 20. Moreover, a lower insulating layer 13 is formed in contact with the lower surface of the lower electrode 15, and an upper insulating layer 23 is formed in contact with the lower surface of the upper electrode 17.

One limitation with the design of the film bulk acoustic resonator 10 shown in FIG. 1 is that the addition of the piezoelectric film 16 and the metal layers 15 and 17 on breaks the symmetry of the film bulk acoustic resonator 10. In other words, the top of substrate layers 11 and 12 is dissimilar to the bottom of such layers.

The asymmetrical design causes vibrations in the thickness direction of the resonator that result in energy leakage out of the resonator. Typically, the piezoelectric MEMS resonators have quality factors that are about an order of magnitude lower than bare silicon resonators at the same frequency. This low quality factor increases the noise in oscillator applications and increases the motional impedance.

One design that attempts to overcome the low quality factor of piezoelectric MEMS resonators is to increase the size of the resonator by using a higher order overtone design, for example, as described in Patent document 1, identified below. While a higher order overtone design directly decreases the motional resistance, it also increases the size of the resonator. Moreover, since the manufacturing cost of the resonator is proportional to the size, the larger resonator size is not preferred. In addition, even for larger resonators, the low motional impedance is still not sufficient for low noise oscillator applications and a higher quality factor is required.

Non patent document 1: V. Kaajakari, T. Mattila, A. Oja, J. Kiihamäki, and H. Seppä, "Square-extensional mode single-crystal silicon micromechanical resonator for low phase noise oscillator applications", IEEE Electron Device Letters, Vol. 25, No. 4, pp. 173-175, April 2004.

Non patent document 2: G. Piazza, P. J. Stephanou, A. P. Pisano, "Piezoelectric Aluminum Nitride Vibrating Contour-Mode MEMS Resonators", Journal of MicroElectro Mechanical Systems, vol. 15, no. 6, pp. 1406-1418, December 2006.

Patent document 1: U.S. Pat. No. 7,924,119.

SUMMARY OF THE INVENTION

Accordingly, the MEMS resonator disclosed herein increases the quality factor of the resonator that results in lower motional impedance without increasing the resonator size.

In one embodiment, the MEMS resonator includes a silicon layer having opposing surfaces, a piezoelectric layer above one of the surfaces of the silicon layer, and a pair of electrode (e.g., metal layers) disposed on opposing surfaces of the piezoelectric layer, respectively. Moreover, the piezoelectric layer has a crystallographic axis that extends at an angle relative to the vertical axis of the MEMS resonator.

In a refinement of the embodiment, the MEMS resonator is a face shear mode resonator that primarily vibrates in an x,y plane of the piezoelectric layer when the pair of electrodes are excited with an electrical current. In yet a further aspect, the MEMS resonator can be a Lamé-mode resonator.

Preferably, the crystallographic axis of the piezoelectric layer extends in the direction at an angle that is equal to or greater than 10°. Preferably, the angle is between 40° and 75° (and ideally at 56°) relative to the direction orthogonal to the first surface of the silicon layer.

In one embodiment, the piezoelectric layer comprises aluminum nitride (AlN) and the pair of metal layers comprise molybdenum (Mo).

In another embodiment, adjacent edges of the piezoelectric layer are oriented along the [100] and [010] directions relative a crystal axis of the silicon layer.

In another embodiment, adjacent edges of the piezoelectric layer are oriented along the [110] directions relative a crystal axis of the silicon layer.

Preferably, the silicon layer, the piezoelectric layer, and the pair of metal layers collectively form a square shape in the x,y plane. Moreover, the square shape of the MEMS resonator has sides, preferably, each with a length between 20 μm and 300 μm. Moreover, the thickness of the MEMS resonator can be between 5 μm and 30 μm.

In another embodiment, the silicon layer forms one of the pair of electrodes.

In another embodiment, a MEMS resonator array comprising a plurality of MEMS resonators is provided. In this embodiment, MEMS resonator a silicon layer having a first surface and a second surface opposite the first surface; a piezoelectric layer disposed above the first surface of the silicon layer and having a crystallographic axis extending in a direction at an angle greater than 0° relative to a direction orthogonal to the first surface of the silicon layer; and a pair of metal layers disposed on opposing surfaces of the piezoelectric layer, respectively. Moreover, each of the plurality of MEMS resonators is arranged laterally with respect to each other as an array.

The above simplified summary of example embodiments serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows. To the accomplishment of the foregoing, the one or more aspects of the present disclosure include the features described and particularly pointed out in the claims.

BRIEF DESCRIPTION OF THE DRAWINGS

The accompanying drawings, which are incorporated into and constitute a part of this specification, illustrate one or more example embodiments of the present disclosure and, together with the detailed description, serve to explain their principles and implementations. The drawings provided are for illustrative purposes only and are therefore not drawn to scale.

DETAILED DESCRIPTION OF THE EXEMPLARY EMBODIMENTS

Example aspects are described herein in the context of a MEMS resonator or MEMS resonator array, and, more particularly, Lamé-mode resonators and other face shear mode resonators where the vibrational motion is in the x,y plane of the resonator and does not vary significant in the thickness direction, i.e., z plane of the resonator. Preferably, the MEMS device described herein can be used in any MEMS based devices that benefit from a high quality factor, such as sensor including gyroscopes and bolometers, for example.

Those of ordinary skill in the art will realize that the following description is illustrative only and is not intended to be in any way limiting. Other aspects will readily suggest themselves to those skilled in the art having the benefit of this disclosure. Reference will now be made in detail to implementations of the example aspects as illustrated in the accompanying drawings. The same reference indicators will be used to the extent possible throughout the drawings and the following description to refer to the same or like items.

Figure 2A:
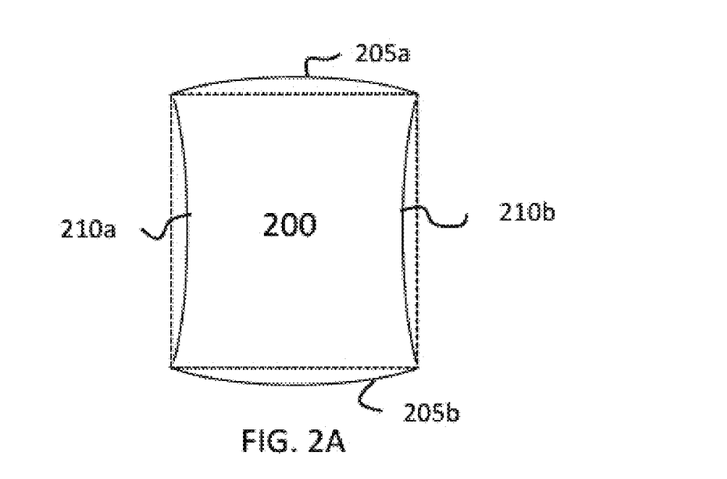
FIGS. 2A and 2B illustrate a top view of a MEMS resonator according to an exemplary embodiment.
Figure 2B:
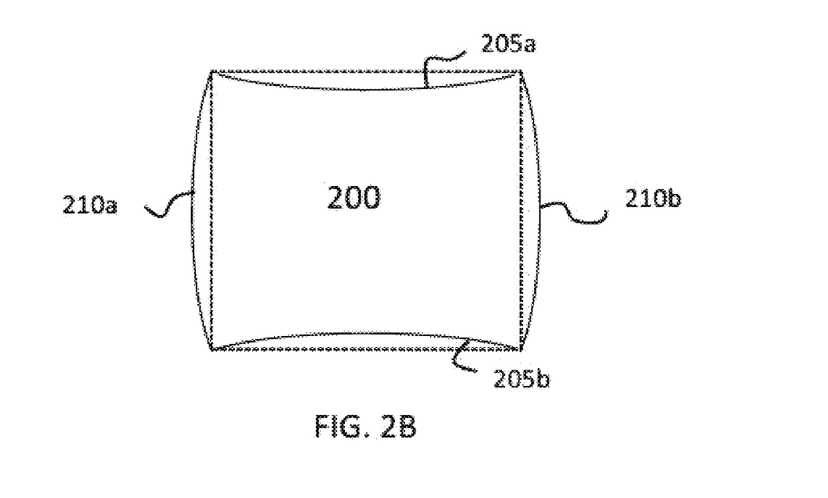

FIGS. 2A and 2B illustrate top views of a MEMS resonator, such as a Lamé-mode resonator, according to an exemplary embodiment. As shown, FIG. 2A illustrates the resonator 200 with Lamé-mode deformation at 0° phase angle and FIG. 2B illustrates the resonator 200 with Lamé-mode deformation at 180° out-of-phase angle. The Lamé-mode can characterized as opposing sides successively expanding and contracting. More particularly, as shown in FIG. 2A, the top and bottom sides 205a and 205b of resonator 200 expand (indicated by outwardly convex solid lines) while the left and right sides 210a and 210b contract (indicated by the inwardly concave solid lines). Then, during excitation, at the 180° out-of-phase angle shown in FIG. 2B, the top and bottom sides 205a and 205b of resonator 200 contract (indicated by inwardly concave solid lines) while the left and right sides 210a and 210b expand (indicated by the outwardly convex solid lines). It is noted that the dotted lines in FIGS. 2A and 2B illustrate the non-vibrational state of all sides (i.e., no expanding or contracting) when the Lamé-mode resonator is not in an excitation state.

According to the exemplary embodiment, the resonator 200 is formed from a square shaped plate with a length of each side between 20 μm to 300 μm. Moreover, the resonator 200 preferably has a thickness of the plate between 5 μm to 30 μm.

Figure 2C:
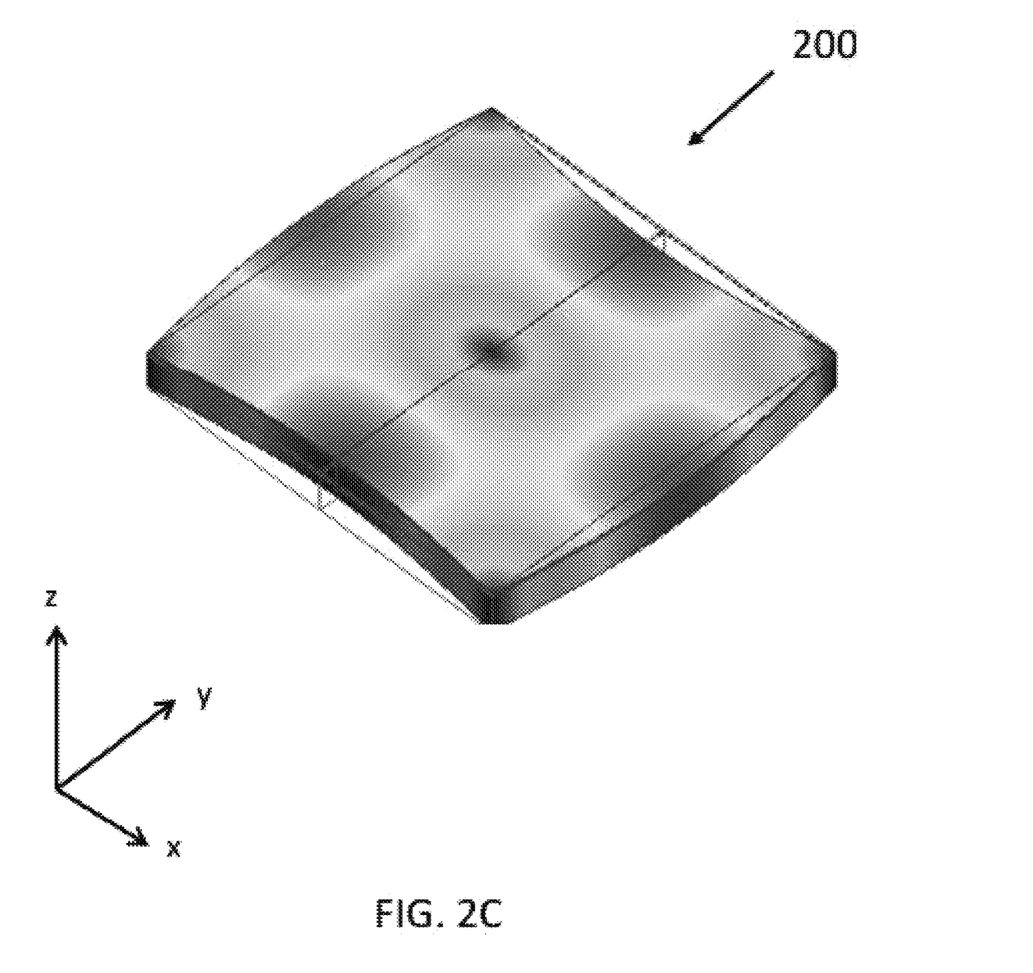
FIG. 2C illustrates a computer-simulated three-dimensional mode shape of the MEMS resonator according to the exemplary embodiment.

FIG. 2C illustrates a computer-simulated three-dimensional mode shape of the MEMS resonator 200 according to the exemplary embodiment. Since the square edges of the resonator plate bend in antiphase as noted above, the plate volume is preserved during excitation and motion and variation in the thickness direction is minimal.

Conventionally, pure Lamé-mode resonators that have been made of single crystal silicon have demonstrated very high quality factors. For example, this type of design for a Lamé-mode resonator can achieve a quality factor of over 1 million at 5 MHz for electrostatically actuated MEMS resonators, for example. Unfortunately, using a single crystal silicon for Lamé-mode resonators does not result in an effective electrostatic coupling. For example, the coupling coefficient may be less than 0.1%, which is certainly too low in many applications and results in too large of a motional impedance.

In contrast, piezoelectric MEMS resonators provide improved coupling coefficient. As described above with respect to FIG. 1, a typical piezoelectric MEMS resonator has an aluminum nitride thin film layer sandwiched between two metal electrodes. Typically, the metal electrodes are molybdenum, but other materials such as platinum or aluminum may also be used. The piezoelectric film may be aluminum nitride (AlN) or doped aluminum nitride, but may also be PZT or titanium oxide.

In addition, the thickness of the metal electrodes is typically 50 nm to 400 nm and the thickness of the piezoelectric film is typically 400 nm to 2 µm. Additional thin film layers may also be provided on such resonators. For example, silicon dioxide thin film can be used to change the temperature coefficient of frequency of the resonator.

However, conventional Lamé-mode resonators are not effectively actuated with the piezoelectric thin film. This is because Lamé-mode operate pure shear resonance mode, meaning that the motion is pure shear deformation and the volume of the resonator is unchanged, as noted above.

According to an exemplary embodiment of the present disclosure, a MEMS resonator is provided with a resonance mode being a Lamé mode. In particular, the c-axis (i.e., the vertical crystallographic axis) of the piezoelectric layer is formed to effectively actuate the resonator 200.

Figure 3A:
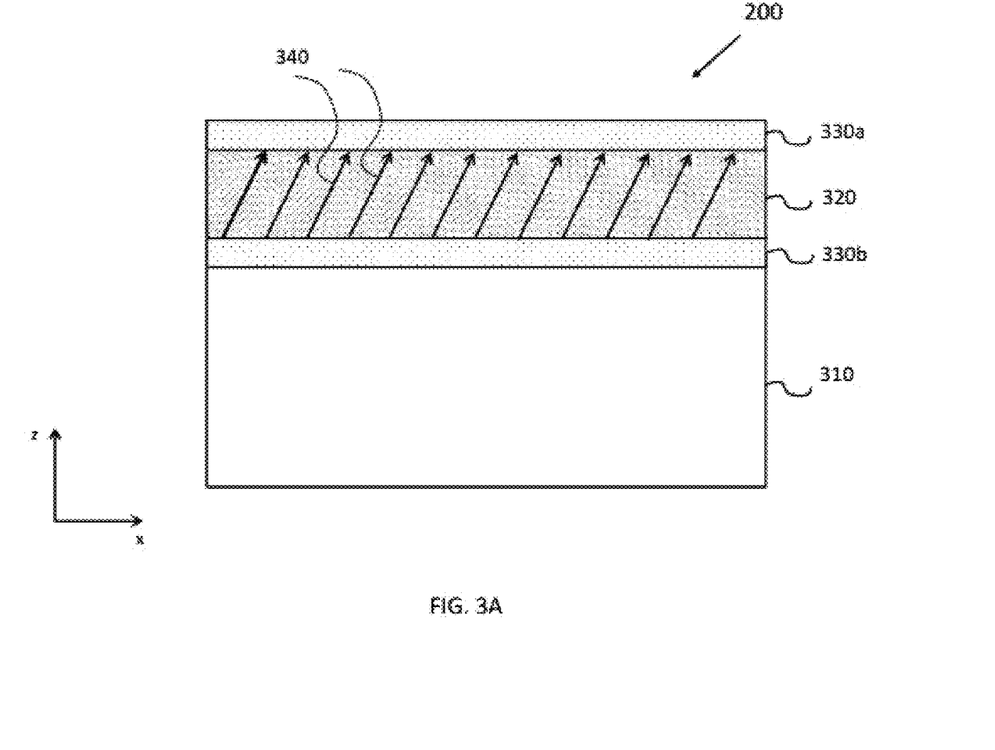
FIG. 3A illustrates a cross-sectional view of a MEMS resonator according to an exemplary embodiment.

Specifically, FIG. 3A illustrates a cross-sectional view of a MEMS resonator according to an exemplary embodiment. In particular, the MEMS resonator 200 includes a structural layer 310, preferably silicon, with opposing first and second surfaces. Preferably, the structural layer thickness may range from 3 µm to 30 µm. Moreover, a piezoelectric layer 320 disposed above the structural layer 310, and a pair of metal electrode layers 330a and 330b disposed on opposing surfaces of the piezoelectric layer 320. Preferably, the piezoelectric layer 320 are formed from aluminum nitride (AlN) and the metal electrode layers 330a and 330b are formed from molybdenum (Mo). According to another aspect, the silicon layer 310 can serve as the second electrode 330b if the silicon layer is made of a degenerate semiconductor. Moreover, although not shown, it should be appreciated that the structural layer 310 can be disposed on a substrate providing mechanical support that can be between 200 µm to 600 µm, for example.

According to the current embodiment, the resonator 200 is effectively coupled by orienting the c-axis of the piezoelectric layer 320 at an angle relative to the vertical axis (z-axis). In other words, the piezoelectric layer is disposed above the first surface of the silicon layer and has a c-axis that extends in a direction at an angle relative to a direction orthogonal to the first surface of the silicon layer.

As described in more detail below, it is known that for lower quality polycrystalline piezoelectric films, and even for high quality piezoelectric film, there may be some slight variation for individual crystal alignment during the manufacturing process. In other words, although the majority of crystals are closely aligned with the vertical axis, which is a direct effect of the manufacturing process (discussed below), there will be some unintended spread/variation on an individual crystal basis even though the average for the crystal alignment will be equal to the vertical axis or within a single degree. In contrast and as will be discussed in detail below, the piezoelectric layer 320 according to the exemplary embodiment is intentionally manufactured such that the average angle for crystals of the layer relative to the vertical axis is not insignificant. Thus, to obtain an effective coupling coefficient, the average angle for crystal alignment of the piezoelectric layer 320 must be at least 5°, although the preferred angles will be discussed below with respect to FIG. 5. For purposes of this disclosure, it is contemplated that when referring to the "crystallographic axis" and/or "c-axis", the axis being referred to is an average of the axes of individual crystals of the piezoelectric layer 320 of the exemplary embodiment.

In particular, as shown FIG. 3A, the resonator 300 is form with the piezoelectric layer 320 having a slanted or tilted c-axis (i.e., 5° or greater), relative to the vertical "z" axis.

The c-axis of the piezoelectric layer 320 is illustrated by reference numeral 340. According to the exemplary embodiment, by tilting the average c-axis orientation of the piezoelectric layer 320 with respect to z-axis of the resonator 300, the resonator 300 achieves a Lamé-mode resonance with an effective electrostatic coupling.

In operation, when an electrical signal is applied between the pair of metal electrodes, the piezoelectric thin film deforms due to the piezoelectric effect. The deformation in the thickness direction (z-axis) is commonly used for actuation of thin film bulk acoustic mode resonators that vibrate in thickness mode. In thickness mode, these resonator vibrate mainly in the thickness direction and the mode can be visualized as two opposing surfaces (top and bottom surfaces) moving out of phase up and down. In addition to the thickness deformation, the piezoelectric film deforms in lateral directions (x and y axis). In conventional resonator devices, there is no preferential lateral direction for the preferential lateral deformations and the lateral stress generated by the piezoelectric effect is equal in all directions in x,y plane. Moreover, the lateral piezoelectric effect has been successfully applied for extensional mode resonators, for example, longitudinal mode beam resonators and extensional plate resonators that vibrate in x,y plane.

In contrast, shear mode resonances, such as face shear modes or Lamé-mode resonances, cannot be excited in conventional structures as there is no preferential direction for the lateral piezoelectric effect. Referring to FIG. 2C, the stress in x and y direction in vertical c-axis oriented piezoelectric film is equal in magnitude and shear mode, which preserves the resonator volume is not excited. When the c-axis of the piezoelectric thin film 320 is oriented off z-axis according to the exemplary embodiment, the symmetry is broken and strain in the x,y plane is not uniform.

Figure 3B:
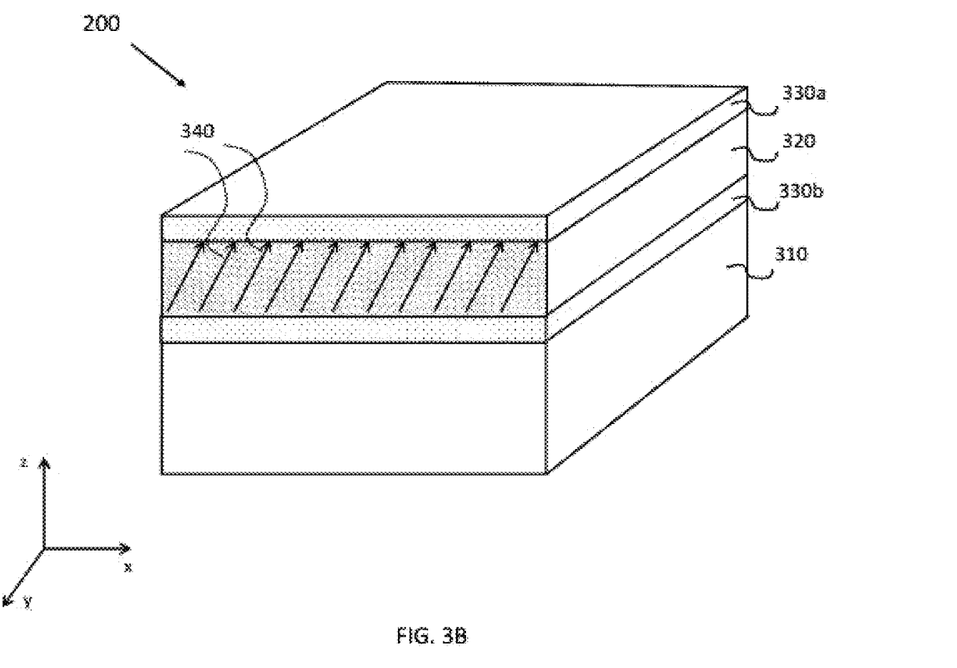
FIG. 3B illustrates a perspective view of the piezoelectric resonator according to the exemplary embodiment in which the crystal c-axis is tilted in the x-axis orientation.

FIG. 3B illustrates a perspective view of the piezoelectric resonator according to the exemplary embodiment in which the crystal c-axis is tilted in the x-axis orientation. When electric field is applied to between the electrodes (330a and 330b), the piezoelectric effect causes lateral stress in x-direction and y-direction but the magnitude of the stresses now differ and may even have opposite sign. The piezoelectric film 320 oriented in this way can effectively couple to in-plane shear modes where motion in x and y directions is in opposite directions. For maximum coupling, it is preferable that off z-axis tilting is aligned along the lateral edges of the resonator (i.e., along x or y as shown in FIG. 3B).

Figure 4:
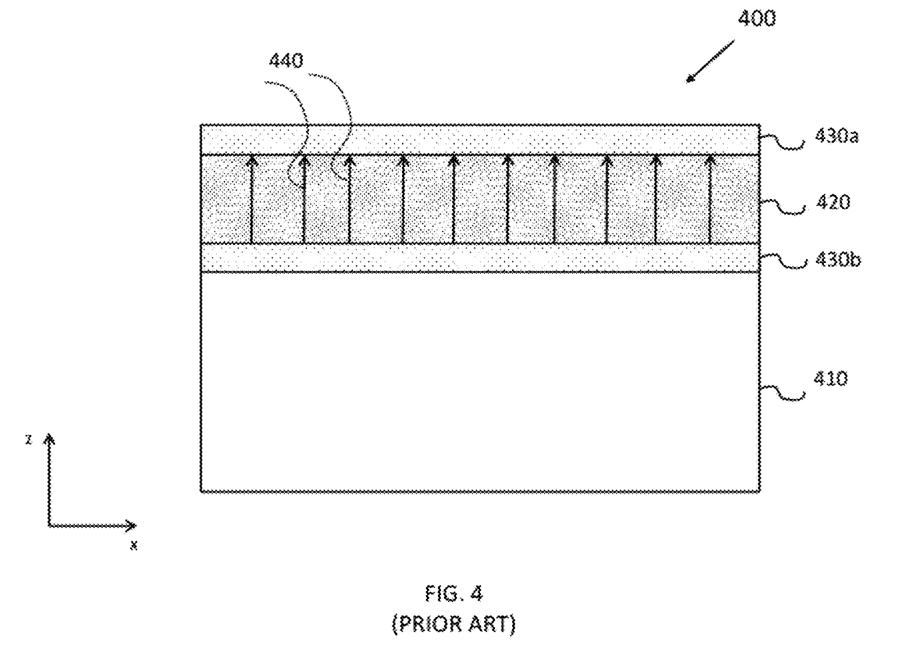
FIG. 4 illustrates a comparative example of a cross-sectional view of a conventional piezoelectric deposition of a MEMS resonator.

FIG. 4 illustrates a comparative example of a cross-sectional view of a conventional piezoelectric deposition of a MEMS resonator 400. In a typical piezoelectric deposition for a resonator, such as the film bulk acoustic resonator 10 shown in FIG. 1 and described above, the c-axis of the piezoelectric layer 420 is aligned in the vertical axis (i.e., the z axis). The vertical c-axis of the piezoelectric layer 420 is the result of the piezoelectric thin film being grown on top of the resonator plate (e.g., by ion beam irradiation) directly downward onto the aluminum layer, such that the c-axis of the piezoelectric layer 420 is perpendicular to the plane defined by the plate resonator.

Due to the vertical c-axis of the piezoelectric layer 420 of such MEMS designs, when a voltage is applied between the top and bottom electrodes 430a and 430b, the electric field causes stress deformation in the piezoelectric thin film 420. This stress deformation effectively actuates extensional modes such as length extension, width extension, or square extension modes. However, due to this design, pure face shear modes, such as the Lamé mode, cannot be actuated.

Typically, during piezoelectric thin film deposition, the c-axis of the piezoelectric film is aligned along z-axis. This alignment follows from the symmetry properties of the deposition substrate and the physical arrangement of the deposition process. Conventionally, neither of them has any preferential in-plane component and the piezoelectric material grows preferentially in crystal structure where the average crystal is aligned to the z-direction.

Conventionally, in a high quality piezoelectric film, the majority of the crystals are closely aligned to the z-axis direction with the spread of the individual crystal alignment generally less than 0.5° from the vertical axis. In lower quality polycrystalline piezoelectric films, the spread of individual crystal alignments can be up to 15 degrees depending on film growth conditions, but the average alignment is still typically in z-direction. By changing the physical arrangement of the deposition, for example, by depositing the piezoelectric material in an oblique angle relative to sample surface, it is possible to grow piezoelectric material where the average c-axis is in angle relative to the z-axis as described herein according to the exemplary embodiment.

In contrast, referring back to FIGS. 3A and 3B, the c-axis of the piezoelectric layer 320 of the exemplary embodiment is set at an angle relative to the vertical axis (z-axis), which achieves a resonance Lamé-mode resonance with an effective electrostatic coupling.

Figure 5:
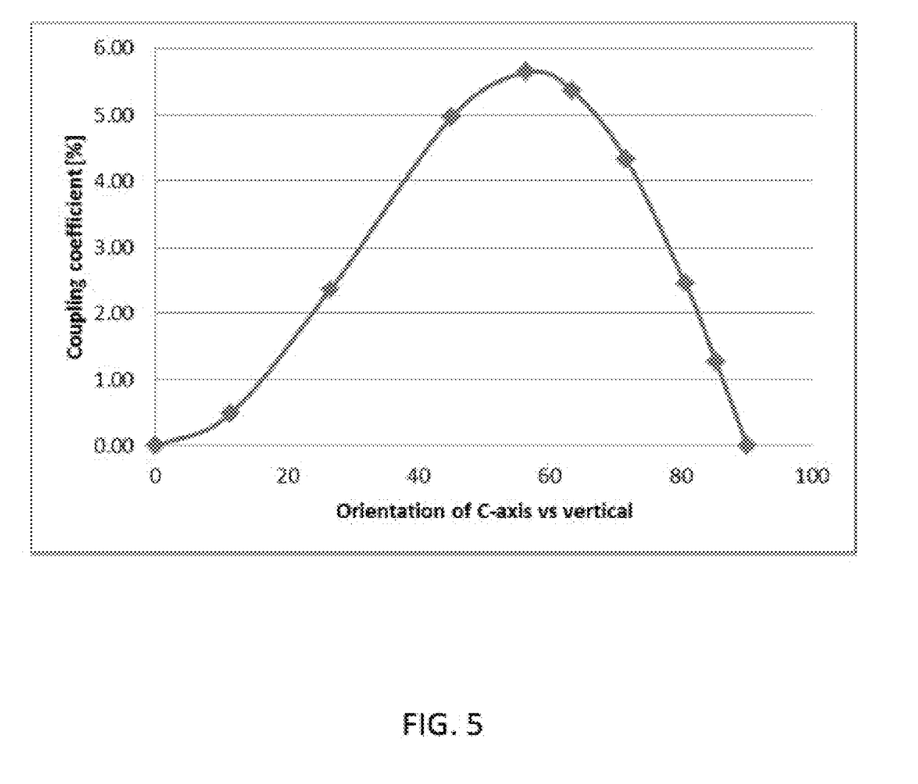
FIG. 5 illustrates a graph showing simulated test results of the coupling coefficient versus the c-axis angle of the piezoelectric layer of the exemplary embodiment.

FIG. 5 illustrates a graph showing simulated test results of the coupling coefficient versus the c-axis angle of the piezoelectric layer 320 of the exemplary embodiment. The orientation (i.e., the x axis) of the graph indicates the orientation of the c-axis of the piezoelectric layer 320 relative to the vertical z axis of the layer. As shown in FIG. 5, as the orientation of the c-axis increases from the vertical axis, the coupling coefficient increases significantly with a maximum coupling coefficient of 5.6% at a c-axis orientation of approximately 56°. For purposes of this disclosure, it is noted that the terms "approximately" or "substantially" as used herein take into account minor variations that may occur during the manufacturing process and the like. For example, during manufacturing, the direction of ion beam irradiation can be set to 56° relative to the vertical axis, but this process may result in a c-axis of the piezoelectric layer that is slightly higher or lower than 56° as would be understood to one skilled in the art.

According to an exemplary embodiment, the c-axis of the piezoelectric layer 320 is preferably between 40° and 75° relative to the z or vertical axis. As shown in the graph of FIG. 5, these angles for the c-axis would result in a coupling coefficient of the MEMS resonator 200 of approximately 4.00% or greater. According to a refinement of this exemplary embodiment, the c-axis of the piezoelectric layer 320 is preferably 56° or approximately 56°, which results in a coupling coefficient of 5.6% as noted above and shown in FIG. 5.

According to the exemplary embodiment, the preferred c-axis for piezoelectric crystal is between 40 to 75 degrees. However, it is appreciated that growing crystals with such a large angle relative to the vertical axis may not be economical due to manufacturing constraints or the like. As shown in FIG. 5, effective piezoelectric coupling can be obtained at angles greater than 10° and especially at angles greater than 20 degrees. Accordingly, according to an alternative embodiment, it is contemplated that the average c-axis for the piezoelectric layer 320 relative to the z-axis can be great than 10°, and, more preferably, greater than 20°.

For MEMS resonators implemented in timing device applications, it is important that the resonator has good temperature stability, as would be understood to one skilled in the art. Moreover, uncompensated Lamé-mode resonators show a negative temperature coefficient of frequency (TCF). This TCF can be compensated by doping the silicon substrate to make the TCF more positive.

Figure 6A:
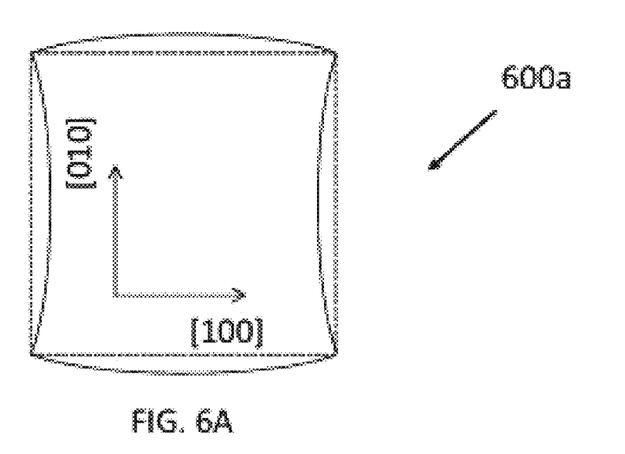
FIGS. 6A and 6B illustrate orientations of the exemplary resonator relative to the silicon crystal axis.
Figure 6B:
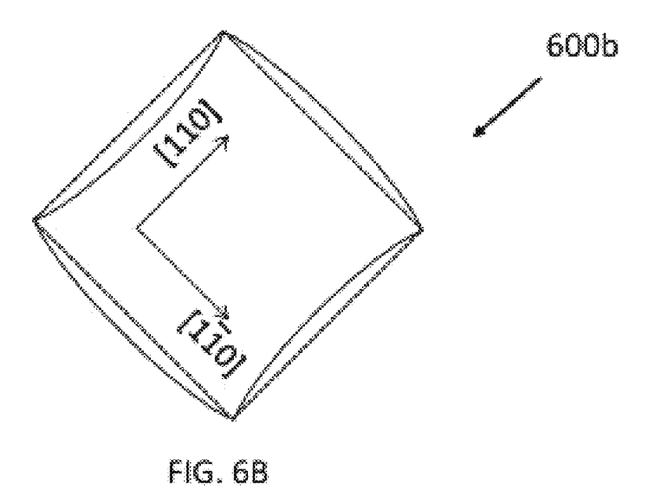

FIGS. 6A and 6B illustrate orientations relative to the silicon crystal axis of the exemplary resonator 200 according to exemplary embodiments, which can be used for timing device applications, for example. In typical silicon process, the silicon surface is in [001] crystal direction, but lateral silicon dimensions are defined lithographically and the resonator side walls can be aligned in any directions. For pure Lamé-mode resonator, the resonator side wall should be aligned either to [100] silicon crystal direction or [110] silicon crystal direction.

FIG. 6A illustrates a Lamé-mode resonator 600a according to an exemplary embodiment in which the edges are oriented along the [100] and [010] directions. In this orientation, the resonance frequency is:

$$f = \frac{1}{2L}\sqrt{\frac{c_{11} - c_{12}}{\rho}}$$

In this case, L is the sides length of the resonator 600a and $\rho$ is the density of the silicon. In general, for silicon resonators, the TCF is largely determined by the elastic constant. According to this orientation, the temperature dependency (i.e., the TCF) is determined by the elastic constants C11 and C12 of silicon. It is known that $C11=16.60*10^{11}$ dyn/cm$^2$ and that $C12=6.40*10^{11}$ dyn/cm$^2$ and these constant have negative temperature coefficient of temperature. Thus, a resonator made of silicon has negative TCF. The TCF can be made more positive by doping the silicon heavily with phosphorus or other n-type dopant. In a preferred embodiment of the resonator 600a, the phosphorus doping density is over $2*10^{19}$ 1/cm$^3$.

Moreover, FIG. 6b illustrates another embodiment of a Lamé-mode resonator 600b with edges oriented along [110] directions. In this embodiment, the resonance frequency of pure silicon resonator is determined by the silicon shear modules C44 (known to be $7.96*10^{11}$ dyn/cm$^2$) as given by:

$$f = \frac{1}{2L}\sqrt{\frac{c_{44}}{\rho}}$$

Again, L is the sides length of the resonator and $\rho$ the density of the silicon. According to this orientation, the temperature coefficient of the shear modulus C44 can be made more positive by doping the silicon heavily with boron or other p-type dopants. This results in more positive TCF. In a preferred embodiment of the resonator 600b, the boron doping density is over $10^{20}$ 1/cm$^3$.

It should be appreciated that for both resonators 600a and 600b, as described above, the resonance frequency is mainly determined by the lateral resonator dimension, i.e., the length L, of the sides of the resonators 600a and 600b and not by the resonator thickness. This is significantly different than a thickness shear mode resonator, such as the bulk film acoustic resonator 10 shown in FIG. 1, for example, where the frequency is determined by the thickness of the device, rather than the lateral dimensions. This is because the variation of the motion in the thickness direction of the present resonator is minimal, as discussed above. The resonator displacement (mode shape) depends mainly on in-plane location (location in x,y plane) and not on location along thickness direction (i.e., the z-direction). In pure Lamé-mode, the motion has no thickness dependency. This is in contrast to thickness mode and thickness shear mode resonators where the displacement has a strong thickness dependence (i.e., the displacement depends on the location along z-axis) and the resonance frequency is determined mainly by the resonator thickness.

Moreover, thickness shear mode resonators typically do not have single crystal silicon as a structural layer. Metals and most piezoelectric thin-films, such as aluminum nitride, has positive TCF that makes them unsuitable for timing reference applications without additional compensation. As already mentioned, silicon TCF can be made positive by doping the silicon. By adjusting the silicon thickness and doping level relative to the thin-film properties, it is possible to make resonator with nearly zero TCF. In typical application, the silicon thickness ranges from 3 µm to 30 µm. In addition, thin film of silicon dioxide can be incorporated in the resonator to make the TCF even more positive.

Figure 7:
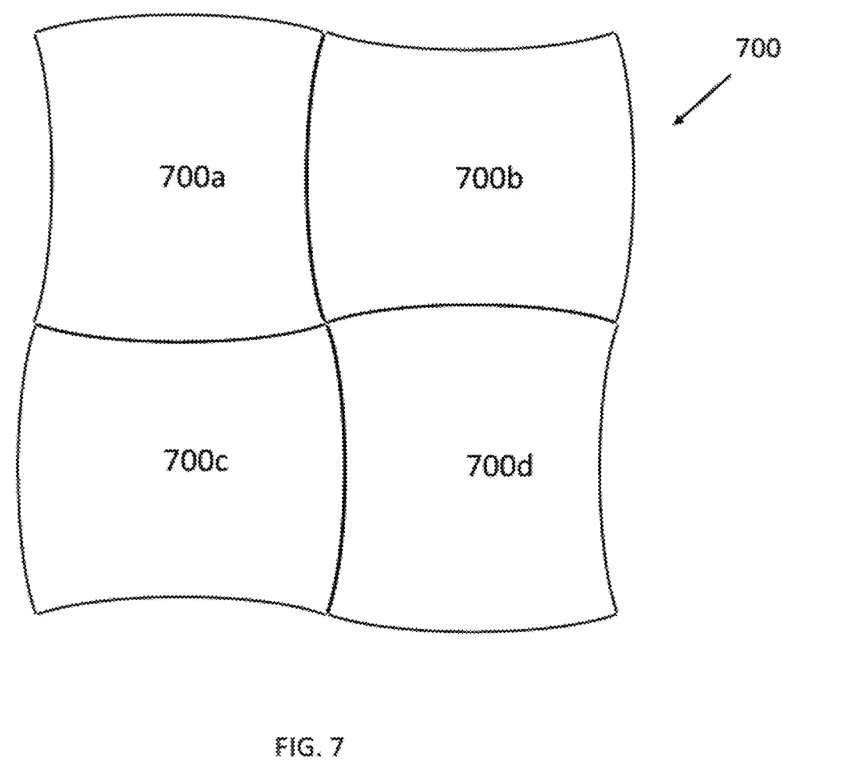
FIG. 7 illustrates a MEMS resonator array according to another exemplary embodiment.

FIG. 7 illustrates the top view of a MEMS resonator array 700 according to another exemplary embodiment. Specifically, for high-frequency resonator applications, it is beneficial to have an array of multiple resonators in parallel. As shown in FIG. 7, the MEMS resonator array 700 includes four Lamé-mode resonators 700a, 700b, 700c, and 700d, where the resonators are connected by the side edges. It should be appreciated that while the array 700 illustrates a device having four resonators attached in parallel, the embodiment should in no way be limited to a specific number of resonators.

Moreover, it should be appreciated that each resonator 700a, 700b, 700c, and 700d, can correspond to resonator 200 illustrated in FIGS. 2 and 3, as described above. Moreover, each of the resonators 700a, 700b, 700c, and 700d, and the piezoelectric transducer elements between them can comprise a common substrate layer, such as silicon layer 310. A common layer means that the resonators 700a, 700b, 700c, and 700d, can be processed from the same layer of an SOI wafer (i.e., the structural layer). According to the exemplary embodiment, the use of multiple resonator elements for the MEMS resonator device 700 increases the resonator size and lowers the motional impedance.

Figure 8:
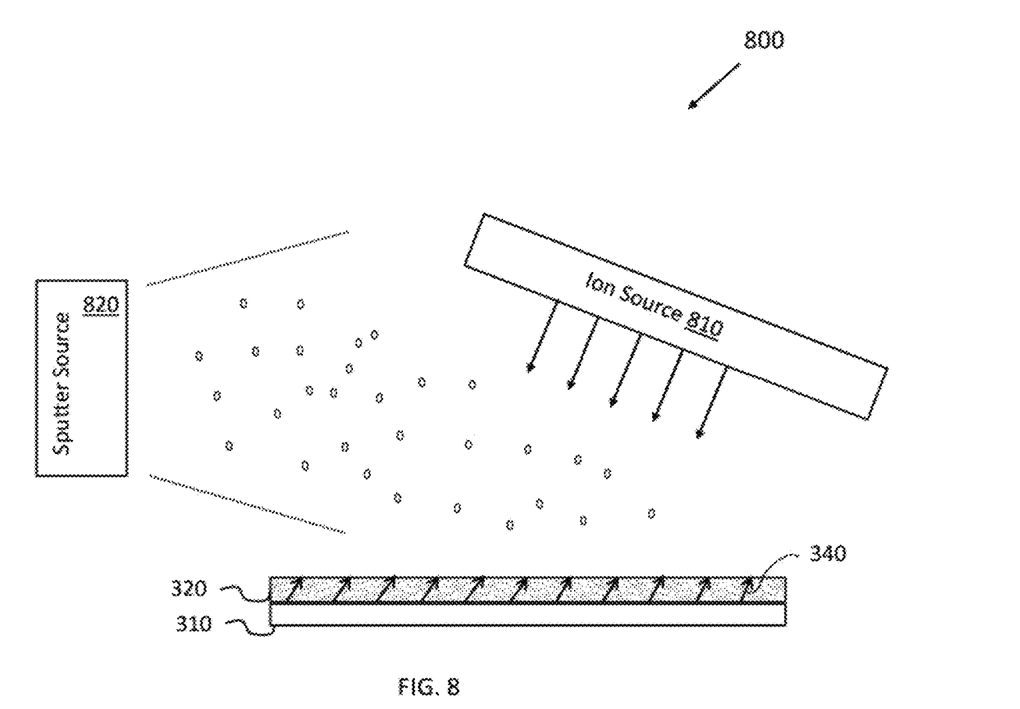
FIG. 8 illustrates a block diagram of an exemplary manufacturing method of the MEMS resonator according to an exemplary embodiment.

FIG. 8 illustrates a block diagram of an exemplary manufacturing method according to an exemplary embodiment. The device is shown only as including the silicon layer 310 and AlN layer 320. As shown, the manufacturing process includes an ion source 810 and sputter source 820. Preferably, the AlN layer 320 is fabricated by ion beam assisted RF magnetron sputtering. For example, an aluminum metal target can be sputtered in an $N_2$/Ar atmosphere provided by the sputter source 820. According to the exemplary embodiment, the ion beams generated by ion source 810 are provided at an angle onto the aluminum metal target to form the tilted c-axis of the resulting piezoelectric film, which is deposited on the silicon layer 810 to form the resulting MEMS resonator 300.

It should be appreciated that according to alternative embodiments, the metal sample can be positioned at an angle during the ion beam irradiation or the ions can be redirected with another ion beam. As long as the angle of the incidence of sputtering is changed to be at an angle, the c-axis of the resulting piezoelectric layer will be tilted according to the exemplary embodiment.

Finally, it should be appreciated that a benefit of the Lamé-mode resonator according to the exemplary embodiment is that the device is a face shear mode resonator. As described above, the resonator volume does not change during the vibration cycle, and, thus, the quality factor of the resonator can be much larger than for the typical extensional mode resonators. Moreover, the TCF of the face shear mode is more easily compensated than the extensional mode as the dopant density does not need to be as high to achieve zero first order TCF, as described above with respect to FIGS. 6A and 6B. Moreover, according to one aspect, if the silicon layer is made of a degenerate semiconductor, the silicon layer can serve as the second electrode.

In the interest of clarity, not all of the routine features of the embodiments are disclosed herein. It should be appreciated that in the development of any actual implementation of the present disclosure, numerous implementation-specific decisions must be made in order to achieve the designer's specific goals, and these specific goals will vary for different implementations and different designers. It is understood that such a design effort might be complex and time-consuming, but would nevertheless be a routine undertaking of engineering for those of ordinary skill in the art, having the benefit of this disclosure.

Furthermore, it is to be understood that the phraseology or terminology used herein is for the purpose of description and not of restriction, such that the terminology or phraseology of the present specification is to be interpreted by those skilled in the art in light of the teachings and guidance presented herein, in combination with the knowledge of the skilled in the relevant art(s). Moreover, it is not intended for any term in the specification or claims to be ascribed an uncommon or special meaning unless explicitly set forth as such.

While the foregoing has been described in conjunction with exemplary embodiments, it is understood that the term "exemplary" is merely meant as an example. Accordingly, the application is intended to cover alternatives, modifications and equivalents, which may be included within the spirit and scope of the MEMS resonator disclosed herein.

REFERENCE SIGNS LIST 200, 600a, 600b: MEMS resonator
205a, 205b, 210a, 210b: edges of MEMS resonator
310: silicon layer
320: piezoelectric layer
330a, 330b: metal layers
430: c-axis of piezoelectric layer
700: MEMS array
810: ion source
820: sputter source

The invention claimed is:

1. A MEMS resonator comprising:
a silicon layer having a first surface and a second surface opposite the first surface;
a piezoelectric layer disposed above the first surface of the silicon layer and having a crystallographic axis extending in a direction at an angle equal to or greater than 5° relative to a direction orthogonal to the first surface of the silicon layer; and
a pair of electrodes disposed on opposing surfaces of the piezoelectric layer, respectively, wherein the crystallographic axis is an average of axes of individual crystals of the piezoelectric layer, and
wherein the MEMS resonator comprises a rectangular shape with a plurality of side edges extending in a direction orthogonal to the first and second surfaces of the silicon layer, such that the plurality of side edges are not anchored to the silicon layer and the MEMS resonator is configured as a face shear mode vibrator with the side edges configured to expand and contract in a direction parallel to the first and second surfaces of the silicon layer.

2. The MEMS resonator according to claim 1, wherein the MEMS is configured to primarily vibrate in an x,y plane of the piezoelectric layer when the pair of electrodes are excited with an electrical current.

3. The MEMS resonator according to claim 2, wherein the face shear mode resonator is a Lamé-mode resonator.

4. The MEMS resonator according to claim 1, wherein the crystallographic axis extends in the direction at an angle that is equal to or greater than 10° relative to the direction orthogonal to the first surface of the silicon layer.

5. The MEMS resonator according to claim 4, wherein the crystallographic axis extends in the direction at an angle that is between 40° and 75° relative to the direction orthogonal to the first surface of the silicon layer.

6. The MEMS resonator according to claim 5, wherein the crystallographic axis extends in the direction at an angle of 56° relative to the direction orthogonal to the first surface of the silicon layer.

7. The MEMS resonator according to claim 1, wherein the piezoelectric layer comprises aluminum nitride (AlN) and the pair of electrodes comprise molybdenum (Mo).

8. A MEMS resonator comprising:
a silicon layer having a first surface and a second surface opposite the first surface;
a piezoelectric layer disposed above the first surface of the silicon layer and having a crystallographic axis extending in a direction at an angle equal to or greater than 5° relative to a direction orthogonal to the first surface of the silicon layer; and
a pair of electrodes disposed on opposing surfaces of the piezoelectric layer, respectively, wherein the crystallographic axis is an average of axes of individual crystals of the piezoelectric layer,
wherein adjacent edges of the piezoelectric layer are oriented along [100] and [010] directions relative a crystal axis of the silicon layer.

9. A MEMS resonator comprising:
a silicon layer having a first surface and a second surface opposite the first surface;
a piezoelectric layer disposed above the first surface of the silicon layer and having a crystallographic axis extending in a direction at an angle equal to or greater than 5° relative to a direction orthogonal to the first surface of the silicon layer; and
a pair of electrodes disposed on opposing surfaces of the piezoelectric layer, respectively,
wherein the crystallographic axis is an average of axes of individual crystals of the piezoelectric layer,
wherein adjacent edges of the piezoelectric layer are oriented along [110] directions relative a crystal axis of the silicon layer.

10. The MEMS resonator according to claim 1, wherein the silicon layer, the piezoelectric layer, and the pair of electrodes collectively form a square shape in the x,y plane.

11. The MEMS resonator according to claim 10, wherein the square shape of the MEMS resonator has sides, each with a length between 20 μm and 300 μm, and wherein the thickness of the MEMS resonator is between 5 μm and 30 μm.

12. A MEMS resonator array comprising:
a plurality of MEMS resonators, each having:
a silicon layer having a first surface and a second surface opposite the first surface;
a piezoelectric layer disposed above the first surface of the silicon layer and having a crystallographic axis extending in a direction at an angle equal to or greater than 5° relative to a direction orthogonal to the first surface of the silicon layer; and
a pair of electrodes disposed on opposing surfaces of the piezoelectric layer, respectively,
wherein each of the plurality of MEMS resonators is arranged laterally with respect to each other as an array, and
wherein the crystallographic axis is an average of axes of individual crystals of the piezoelectric layer, and
wherein each MEMS resonator comprises a rectangular shape with a plurality of side edges extending in a direction orthogonal to the first and second surfaces of the silicon layer, such that the plurality of side edges are not anchored to the respective silicon layer and the MEMS resonator is configured as a face shear mode vibrator with the side edges configured to expand and contract in a direction parallel to the first and second surfaces of the silicon layer.

13. The MEMS resonator array according to claim 12, wherein each of the MEMS resonators is configured to primarily vibrate in an x,y plane of the piezoelectric layer when the pair of electrodes are excited with an electrical current.

14. The MEMS resonator array according to claim 13, wherein each face shear mode resonator is a Lamé-mode resonator.

15. The MEMS resonator array according to claim 12, wherein the crystallographic axis of each MEMS resonator extends in the direction at an angle that is equal to or greater than 10° relative to the direction orthogonal to the first surface of the silicon layer.

16. The MEMS resonator array according to claim 12, wherein the crystallographic axis of each MEMS resonator extends in the direction at an angle that is between 40° and 75° relative to the direction orthogonal to the first surface of the silicon layer.

17. The MEMS resonator array according to claim 16, wherein the crystallographic axis of each MEMS resonator extends in the direction at an angle of 56° relative to the direction orthogonal to the first surface of the silicon layer.

18. The MEMS resonator array according to claim 12, wherein adjacent edges of the piezoelectric layer of each MEMS resonator are oriented along [100] and [010] directions relative a crystal axis of the silicon layer.

19. The MEMS resonator array according to claim 12, wherein adjacent edges of the piezoelectric layer of each MEMS resonator are oriented along [110] directions relative a crystal axis of the silicon layer.

* * * * *